US010468569B2

United States Patent
Sorg et al.

(10) Patent No.: US 10,468,569 B2
(45) Date of Patent: Nov. 5, 2019

(54) METHOD OF PRODUCING A CONNECTION SUPPORT, CONNECTION SUPPORT AND OPTOELECTRONIC SEMICONDUCTOR COMPONENT COMPRISING A CONNECTION SUPPORT

(71) Applicants: OSRAM GmbH, München (DE); ALANOD GmbH & Co. KG, Ennepetal (DE); Heraeus Deutschland GmbH & Co. KG, Hanau (DE)

(72) Inventors: Jörg Erich Sorg, Regensburg (DE); Stefan Ziegler, Sprockhövel (DE); Michael Austgen, Essen (DE); Alexander Peetsch, Gevelsberg (DE); Eckhard Ditzel, Linsengericht (DE); Michael Benedikt, Neuberg (DE)

(73) Assignees: OSRAM Opto Semiconductor GmbH, Regensburg (DE); Heraeus Deutschland Gmbh & Co. KG, Hanau (DE); ALANOD GmbH & Co. KG, Ennepetal (DE)

( * ) Notice: Subject to any disclaimer, the term of this patent is extended or adjusted under 35 U.S.C. 154(b) by 0 days.

(21) Appl. No.: 15/574,385

(22) PCT Filed: Apr. 19, 2016

(86) PCT No.: PCT/EP2016/058643
§ 371 (c)(1),
(2) Date: Nov. 15, 2017

(87) PCT Pub. No.: WO2016/184632
PCT Pub. Date: Nov. 24, 2016

(65) Prior Publication Data
US 2018/0138379 A1 May 17, 2018

(30) Foreign Application Priority Data
May 15, 2015 (DE) .................. 10 2015 107 657

(51) Int. Cl.
*H01L 33/62* (2010.01)
*B32B 15/04* (2006.01)
(Continued)

(52) U.S. Cl.
CPC ............... *H01L 33/62* (2013.01); *B32B 7/12* (2013.01); *B32B 15/00* (2013.01); *B32B 15/04* (2013.01);
(Continued)

(58) Field of Classification Search
CPC . H01L 2924/00014; H01L 2224/48091; H01L 25/167; H01L 2924/1532;
(Continued)

(56) References Cited

U.S. PATENT DOCUMENTS 4,158,745 A 6/1979 Keller
6,007,668 A 12/1999 Kodani et al.
(Continued)

FOREIGN PATENT DOCUMENTS

CN 102414826 A 4/2012
CN 103972361 A 8/2014
(Continued)

OTHER PUBLICATIONS

Aakalu, N. G., et al., "High Thermal Conductance Printer Circuit Card," IBM Technical Disclosure Bulletin, vol. 25, No. 5, Oct. 1, 1982, pp. 2351-2352.
(Continued)

*Primary Examiner* — Caridad Everhart
(74) *Attorney, Agent, or Firm* — DLA Piper LLP (US)

(57) ABSTRACT

A method of producing at least one connection carrier includes: A) providing a carrier plate with a planar top face; B) applying at least one electrically insulating insulation strip to the top face and cohesively connecting the carrier plate and the insulation strip; and C) applying at least one
(Continued)

electrically conductive conductor strip to an adhesive surface of the insulation strip and cohesively connecting the insulation strip and the conductor strip, wherein the conductor strip and the carrier plate are electrically insulated from one another by the insulation strip.

18 Claims, 4 Drawing Sheets

(51) Int. Cl.

| | | |
|---|---|---|
| H01L 23/00 | (2006.01) | |
| H01L 31/02 | (2006.01) | |
| B32B 15/08 | (2006.01) | |
| H05K 1/05 | (2006.01) | |
| H05K 3/10 | (2006.01) | |
| B32B 15/00 | (2006.01) | |
| B32B 7/12 | (2006.01) | |
| B32B 37/12 | (2006.01) | |
| H01L 25/16 | (2006.01) | |
| H01L 33/54 | (2010.01) | |
| H05K 3/00 | (2006.01) | |
| H05K 3/38 | (2006.01) | |

(52) U.S. Cl.
CPC .............. *B32B 15/08* (2013.01); *B32B 37/12* (2013.01); *H01L 24/48* (2013.01); *H01L 25/167* (2013.01); *H01L 31/02005* (2013.01); *H01L 33/54* (2013.01); *H05K 1/056* (2013.01); *H05K 3/103* (2013.01); *B32B 2307/20* (2013.01); *B32B 2307/202* (2013.01); *B32B 2307/206* (2013.01); *B32B 2307/40* (2013.01); *B32B 2457/00* (2013.01); *B32B 2457/14* (2013.01); *H01L 2224/48091* (2013.01); *H01L 2224/48225* (2013.01); *H01L 2224/97* (2013.01); *H01L 2924/12041* (2013.01); *H01L 2924/12043* (2013.01); *H01L 2924/1511* (2013.01); *H01L 2924/1532* (2013.01); *H01L 2933/0066* (2013.01); *H05K 3/0097* (2013.01); *H05K 3/386* (2013.01); *H05K 2201/0358* (2013.01); *H05K 2201/0394* (2013.01); *H05K 2201/055* (2013.01); *H05K 2201/09063* (2013.01); *H05K 2201/1028* (2013.01); *H05K 2201/10106* (2013.01); *H05K 2203/1545* (2013.01)

(58) Field of Classification Search
CPC ... H01L 33/62; H01L 31/02005; B32B 15/04; B32B 15/08; B32B 2307/40; B32B 2307/202; B32B 37/12; H05K 3/12; H05K 3/103; H05K 1/056; H05K 2201/0394
See application file for complete search history.

(56) References Cited

U.S. PATENT DOCUMENTS

| | | | |
|---|---|---|---|
| 6,661,029 B1 * | 12/2003 | Duggal | ............... H01L 27/3211 |
| | | | 257/100 |
| 8,975,532 B2 | 3/2015 | Friedrich et al. | |
| 9,012,940 B2 | 4/2015 | Walter et al. | |
| 9,763,330 B2 | 9/2017 | Behringer et al. | |
| 2005/0214963 A1 * | 9/2005 | Daniels | .................. H01L 24/29 |
| | | | 438/29 |
| 2008/0123334 A1 | 5/2008 | Hochstein | |
| 2009/0050355 A1 | 2/2009 | Chun | |
| 2009/0231848 A1 * | 9/2009 | Huang | ..................... F21K 9/00 |
| | | | 362/249.01 |
| 2013/0070452 A1 | 3/2013 | Urano et al. | |
| 2015/0317553 A1 * | 11/2015 | Pueschner | ........... G06K 19/077 |
| | | | 235/492 |

FOREIGN PATENT DOCUMENTS

| | | |
|---|---|---|
| DE | 1 590 526 A1 | 9/1969 |
| DE | 10 2010 011 719 | 9/2011 |
| WO | 2005/088737 A1 | 9/2005 |
| WO | 2008/021269 | 2/2008 |

OTHER PUBLICATIONS

The First Office Action dated Jul. 23, 2019, of counterpart Chinese Application No. 201680027955.3, along with an English translation.

"Electronic Technology Practice Course" B1 *Manqing National Defense Industry Press*, Feb. 29, 2008, p. 120.

* cited by examiner

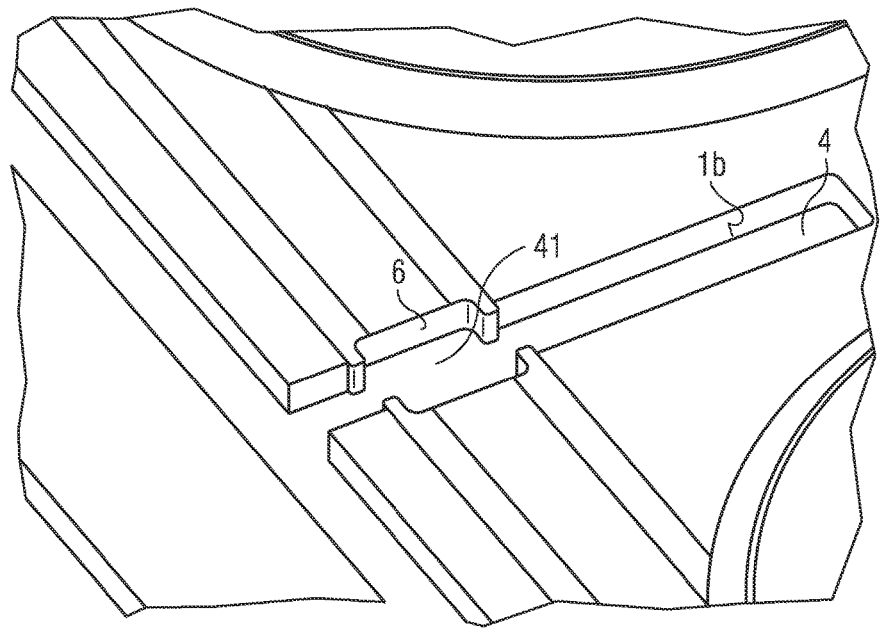
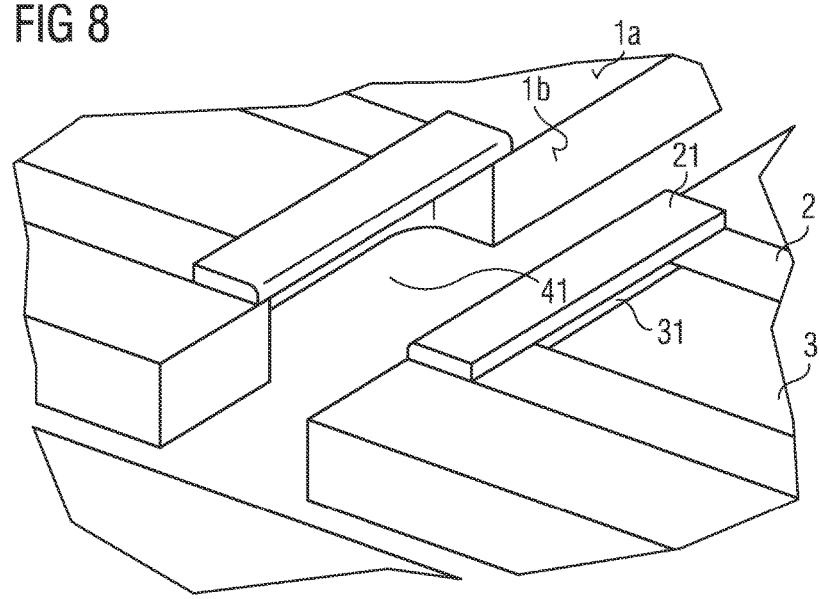

METHOD OF PRODUCING A CONNECTION SUPPORT, CONNECTION SUPPORT AND OPTOELECTRONIC SEMICONDUCTOR COMPONENT COMPRISING A CONNECTION SUPPORT

TECHNICAL FIELD

This disclosure relates to a method of producing a connection support, a connection support and an optoelectronic semiconductor component including a connection support.

BACKGROUND

U.S. Pat. No. 8,975,532 B2 describes a connection carrier and a method of producing such a connection carrier.

There is a need to provide a simplified and inexpensive method of producing a connection carrier, a connection carrier that can be produced in a simplified and inexpensive manner, and an optoelectronic semiconductor component having such a connection carrier.

SUMMARY

We provide a method of producing at least one connection carrier, including:
A) providing a carrier plate with a planar top face,
B) applying at least one electrically insulating insulation strip to the top face and cohesively connecting the carrier plate and the insulation strip, and
C) applying at least one electrically conductive conductor strip to an adhesive surface of the insulation strip and cohesively connecting the insulation strip and the conductor strip, wherein the conductor strip and the carrier plate are electrically insulated from one another by the insulation strip.

We also provide a connection carrier for electronic components, including a carrier plate with a planar top face, at least one electrically insulating insulation strip applied to the top face, and at least one electrically conductive conductor strip applied to an adhesive surface, remote from the top face, of the insulation strip, wherein the carrier plate and the insulation strip and the insulation strip and the conductor strip are in each case cohesively connected and the conductor strip and the carrier plate are electrically insulated from one another by the insulation strip.

We further provide an optoelectronic semiconductor component including the connection carrier for electronic components including a carrier plate with a planar top face, at least one electrically insulating insulation strip applied to the top face, and at least one electrically conductive conductor strip applied to an adhesive surface, remote from the top face, of the insulation strip, wherein the carrier plate and the insulation strip and the insulation strip and the conductor strip are in each case cohesively connected and the conductor strip and the carrier plate are electrically insulated from one another by the insulation strip, and at least one optoelectronic semiconductor chip with connection points, wherein the at least one semiconductor chip is applied to a mounting surface of the carrier plate in a mounting region of the connection carrier, and at least one connection point electrically conductively connects with the at least one conductor strip.

BRIEF DESCRIPTION OF THE DRAWINGS

FIGS. 5, 6, 7 and 8 show examples of a connection carrier, an optoelectronic semiconductor component and a method described here.

LIST OF REFERENCE SIGNS

Figure 1:
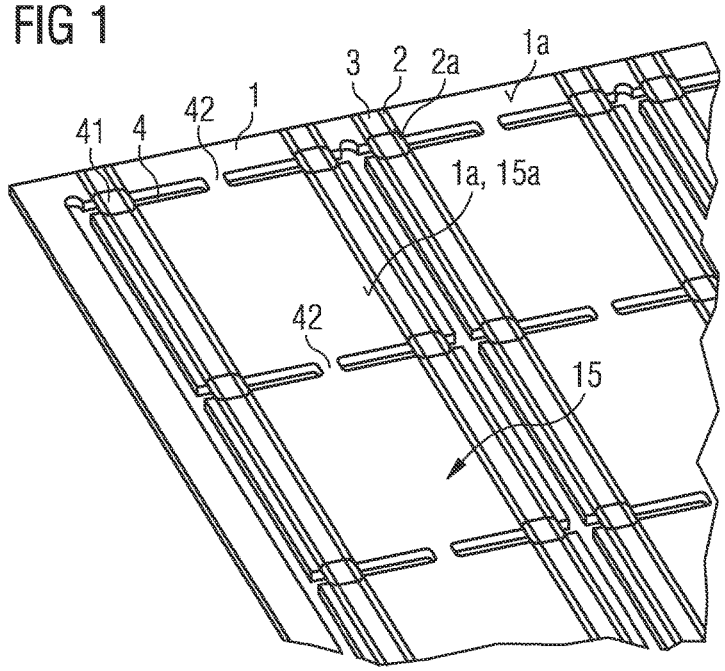
FIG. 1 shows an example of a connection carrier described here and a method described here.

1 Carrier plate
1a Top face
1b Side faces
1c Bottom face
11 Base plate
12 Metallic reflective layer
13 Dielectric multilayer system
14 Layer sequence
15 Mounting region
15a Mounting surface
2 Insulation strip
2a Adhesive surface
2L Length of the insulation strip
2B Width of the insulation strip
21 Folded-over region of the insulation strip
Conductor strip
3L Length of the conductor strip
3B Width of the conductor strip
31 Folded-over region of the conductor strip
4 Recesses
41 Pockets in recesses
42 Bridges
6 Insulation layer
61 Insulating material
5 Optoelectronic semiconductor chip
51 Connection points
52 Wire bonding
53 Conversion potting compound
54 Stop dam

DETAILED DESCRIPTION

We provide a method of producing at least one connection carrier. The connection carrier may serve in mechanical fastening and stabilization and electrical contacting of at least one electronic component. The connection carrier, for example, comprises a printed circuit board. The electronic component may be an electronic, in particular an optoelectronic, semiconductor chip.

In the method, a carrier element may be provided. The carrier element in particular comprises a carrier plate.

The carrier plate comprises a flat top face and a bottom face remote from the top face. In other words, the top face is planar or plane. The bottom face may likewise be flat. A flat face is distinguished in particular in that, within the bounds of manufacturing tolerances, it does not have any raised portions and/or indentations. In this case, it is possible for the top face to be of multiply connected configuration.

The carrier plate comprises a main plane of extension along which it extends in two lateral directions. The main plane of extension extends, within the bounds of manufacturing tolerances, parallel to or along the top face and/or bottom face. Perpendicular to the main plane of extension, in a vertical direction, the carrier plate has a thickness. The thickness of the carrier plate is small compared to the extent of the carrier plate in the lateral directions.

The carrier plate may in particular be a thin plate formed with a metal. The thickness of the carrier plate amounts to at least 0.3 mm, preferably at least 0.4 mm, and at most 2.2 mm, preferably at most 2.1 mm.

At least one electrically insulating insulation strip may be applied to the top face of the carrier plate.

The "strip" is an elongate, for example, ribbon-like, component that is, for example, rectangular when viewed in plan view in an unreeled state, i.e. from a direction perpendicular to a main plane of extension of the component. The strip may in particular have outer edges extending straight, parallel to the main plane of extension and with no curvature.

The insulation strip may, for example, be formed with an oxide, a nitride, a polymer and/or a plastics material or consist of one of these materials.

The insulation strip may, for example, be formed with or consist of an epoxy resin adhesive, in particular a modified epoxy resin adhesive (for example, "B-staged epoxy adhesive") or an acrylic adhesive, in particular a modified acrylic adhesive (for example, "B-staged acrylic adhesive"). The insulation strip may further be formed with or consist of a PSA (Pressure-Sensitive Adhesive) such as, for example, acrylic polymers, polyisobutylene (PIB), ethylene-vinyl-acetate (EVA), silicone adhesive or styrene block polymers (SBS, SEBS, SEP). A PSA is distinguished in that it develops its adhesive effect only once pressure is applied, for example, in a laminating process. It is moreover possible for the material of the insulation strip to be based on hot-melt adhesives, in particular on thermoplastic materials such as, for example, polyethylene or polyamide.

The carrier plate and the at least one insulation strip may be cohesively connected to one another. A "cohesive connection" is a connection at which the connection components are held together by atomic and/or molecular forces. A cohesive connection is distinguished in that mechanical non-destructive disconnection is impossible. This means that, in an attempt to undo the connection by mechanical application of force, at least one of the connection components is destroyed and/or damaged. The cohesive connection is, for example, an adhesive connection, a welded connection and/or a fusion connection. Furthermore, the cohesive connection may be produced by spraying and/or vapor depositing the material of the insulation strip onto the top face.

After applying the at least one insulation strip, the latter covers the top face of the carrier plate at least in part. In this case, the top face may be freely accessible at least in places. It is furthermore possible for the insulation strip to cover the top face completely. The adhesive surface of the insulation strip may then be freely accessible from outside at least in places.

At least one electrically conductive conductor strip may be applied to an adhesive surface of the insulation strip and cohesively connected to the insulation strip. The adhesive surface of the insulation strip may in particular be an outer face of the insulation strip, which outer face is remote from the top face after application of the insulation strip thereto.

The conductor strip is, for example, formed with a metal such as copper, a copper alloy, aluminum, steel or iron or consists of one of these materials. This allows simple contacting of a contact face, remote from the carrier plate, of at least one conductor strip by, for example, wire bonding. The contact face may additionally be prepared using an electroplating process. Sequences of layers, for example, built up as follows, are suitable for this purpose: Ni—Pd—Au, Ni—Ag, Ni—Au, Ag, and/or Ni—P. Alternatively or in addition, the contact face may be coated with an OSP coating (OSP: Organic Surface Protection). Such an OSP coating may, for example, comprise a benzotriazole post-dip solution. Furthermore, a base surface of the conductor strip facing the adhesive surface may, for example, be pretreated using roughening processes such as sand-blasting, etching and/or galvanizing, to make it easier to join it to the insulation strip.

The conductor strip and the carrier plate may be electrically insulated from one another by the insulation strip. To this end, the insulation strip may completely cover the base surface of the conductor strip. It is additionally possible for the insulation strip to project beyond the conductor strip in at least one lateral direction. In other words, the insulation strip may be wider than the conductor strip.

The method may comprise the following steps:

A) providing a carrier plate with a planar top face,

B) applying at least one electrically insulating insulation strip to the top face and cohesively connecting the carrier plate and the insulation strip, C) applying at least one electrically conductive conductor strip to an adhesive surface of the insulation strip and cohesively connecting the insulation strip and the conductor strip, wherein the conductor strip and the carrier plate are electrically insulated from one another by the insulation strip.

It is in particular possible to use the method described here to produce a multiplicity of connection carriers, wherein step C) is followed by a singulation step.

Cohesive connection of the carrier plate and the insulation strip in step B) and/or cohesive connection of the insulation strip and the conductor strip in step C) may be performed using a laminating process and/or an adhesive bond. It is in particular possible for the cohesive connection in all three steps A), B) and C) to be performed using a laminating process and/or an adhesive bond. Use of a laminating process or an adhesive bond is distinguished by simple and inexpensive implementation.

The insulation strip on the adhesive surface and/or on an attachment surface may, for example, be adhesive-coated. The adhesive may be a PSA. The insulation strip may thus be an adhesive strip (so called liner) and/or a protective film. The insulation strip may, for example, be peeled off a protective film and adhered to the top face. If the insulation strip is adhered to the top face by an adhesive, it is possible for the adhesive to contain additional fillers as spacer particles to allow uniform adhesive thickness when exposed to pressure.

It is alternatively or additionally possible for the insulation strip and/or the conductor strip to be applied using a printing method. The insulation strip and/or the conductor strip may moreover be applied by jetting, spraying, spin coating, vapor deposition or dispensing.

The idea behind the method is in particular that of using inexpensive connection methods to cohesively connect the conductor strip or the insulation strip to the carrier plate. Laminating processes, adhesive bonds and/or printing methods are in particular suitable for this purpose. Inexpensive materials may moreover be used for the individual components of the connection carrier. This makes it possible to use a carrier plate with the desired specific characteristics such as, for example, the reflectivity and/or thermal conductivity thereof, inexpensively in a connection carrier. The conductor tracks required to electrically contact an electronic component may be applied simply and inexpensively to the carrier plate as conductor strips.

Provision of the carrier plate in step A) and application of the at least one conductor strip in step C) may be carried out using a reel-to-reel process. In such a process, the carrier plate, the at least one conductor strip and optionally the insulation strip are provided wound into a reel. The carrier plate, the at least one conductor strip and optionally the at least one insulation strip are then unreeled and joined together. Joining may be performed in particular using a laminating process. The finished connection carrier is then wound back onto a reel.

Such a reel-to-reel process allows quick and inexpensive production of the connection carrier. It is in particular possible for the carrier plate, the at least one conductor strip and the at least one insulation strip each to be provided wound into a reel. Cohesively connecting the carrier plate and the insulation strip and cohesively connecting the conductor strip and the insulation strip may then take place in a joint method step.

Application of the at least one conductor strip in step C) may proceed prior to application of the at least one insulation strip to the top face in step B). The insulation strip and the conductor strip are then applied in particular jointly to the carrier plate. In this case, it is possible for the conductor strip and the insulation strip to cohesively connect to one another and then be jointly wound into a reel.

Prior to application of the at least one insulation strip to the top face in step B), a multiplicity of recesses may be introduced into the carrier plate. In other words, the carrier plate is prepatterned. The recesses may, for example, be introduced by a stamping process, laser cutting, water-jet cutting, sand-blasting and/or etching. The recesses may extend right through the carrier in the vertical direction.

The recesses may be isolating structures. Each recess, for example, comprises a main direction of extension, along which it extends. The main direction of extension may be one of the two lateral directions. In particular, the recesses may enclose the region of the carrier plate corresponding to the connection carrier to be produced in the manner of a frame. The recesses may here be separated from one another in part by bridges of the carrier plate. In a step following step C), singulation of the at least one connection carrier may take place along the recesses and through the bridges.

It is furthermore possible for the recesses at least in part to have pockets. The pockets may be formed by a portion of the recesses having a greater thickness in at least one lateral direction perpendicular to the main direction of extension than the remaining portion of the recesses. The pockets may be used to increase creepage distances for leakage current along the insulation strip and thereby prevent a short circuit between the conductor strip and the carrier plate.

Application of the at least one conductor strip in step C) may proceed such that the conductor strip covers over at least one of the recesses at least in places. The recess then has a covered-over region. The covered-over region of the recesses may in particular be at least one region of the pockets. In other words, each pocket of the recesses may be covered over at least in part by a conductor strip. Singulation of the at least one conductor strip may proceed at the covered-over region of the recess. "Covering-over" by the at least one conductor strip may here and hereinafter arise when the conductor strip extends over the recesses. The covered-over region of the recesses is then in particular no longer freely accessible from the top face of the carrier plate. At the covered-over region of the recess, the conductor strip may be self-supporting.

Prior to step B) a multiplicity of recesses may be introduced into the in the carrier plate and the application in step C) proceeds such that the conductor strip covers over at least one of the recesses at least in places.

After application of the at least one conductor strip in step C), a region of the conductor strip and a region of the insulation strip may be folded over in the covered-over region of the recess. In other words, the conductor strip is folded. The folding over may proceed, for example, by a cutting and/or stamping tool. This makes it possible for the conductor strip and optionally the insulation strip first to be severed at the covered-over region of the recess and then jointly folded over. Folding over may proceed about an axis of rotation extending in one of the lateral directions of the carrier plate. In particular, the conductor strip and the insulation strip may be rotated about the axis of rotation by at least 160° and at most 200°, in particular by 180°.

After folding over, the conductor strip may comprise a folded-over region and a non-folded-over region. It is possible for the folded-over region of the conductor strip to be joined at a side remote from the carrier plate to the non-folded-over region of the conductor strip. It is furthermore possible for the folded-over region of the insulation strip to be joined at least in part to the non-folded-over region of the insulation strip.

The folded-over region of the conductor strip and the folded-over region of the insulation strip may be arranged, after folding over, on a side, remote from the carrier plate, of the non-folded-over region of the conductor strip. In this case, the conductor strip is covered up at the covered-over region of the recess once the insulation strip is folded over. In other words, the conductor strip is no longer freely accessible at the covered-over region of the recess.

After folding over, part of the adhesive surface of the folded-over region of the insulation strip and part of the adhesive surface of the non-folded-over region of the insulation strip may face one another. Furthermore, the part of the adhesive surface of the folded-over region and the part of the adhesive surface of the non-folded over region may be in direct contact with one another and in particular be cohesively connected together. Part of the contact area of the folded-over region of the conductor strip and part of the contact area of the non-folded-over region of the conductor strip may likewise face one another and in particular be in direct contact with one another.

After application of the at least one conductor strip in step C), a region of the conductor strip and a region of the insulation strip may be folded over in the covered-over region of the recess. The folded-over region of the conductor strip and the folded-over region of the insulation strip are then arranged on a side, remote from the carrier plate, of the non-folded-over region of the conductor strip. After folding-over, the conductor strip is covered up at the covered-over region of the recess by the folded-over region of the insulation strip.

By folding over the conductor strip and the insulation strip, it is possible to ensure that at the folded-over region the creepage distances between the carrier plate and the conductor strip are increased and the free ends of the conductor strip are potential-free. In addition, the at least one conductor strip may be sealed by the insulation strip. To fasten the folded-over region, it is in particular possible to make use of the stickiness of the adhesive surface of the insulation strip. To this end, in particular, a cohesive connection may be produced between the folded-over region of the insulation strip and the non-folded-over region of the insulation strip. This may proceed, for example, by the introduction of temperature and pressure. Alternatively or in addition, it is possible for a sticking agent such as, for example, an adhesive to be introduced between the folded-over and the non-folded-over regions of the conductor strip and/or of the insulation strip.

A connection carrier for an electronic component is additionally provided. The connection carrier may preferably be produced using a method described here. This means that all the features disclosed for the method are also disclosed for the connection carrier and vice versa.

The connection carrier may comprise a carrier plate with a planar top face. Furthermore, the connection carrier may comprise at least one electrically insulating insulation strip applied to the top face of the carrier plate, and an electrically conductive conductor strip applied to an adhesive surface, remote from the top face, of the insulation strip. The carrier plate and the insulation strip and the insulation strip and the conductor strip each cohesively connect to one another. In addition, the conductor strip and the carrier plate are electrically insulated from one another by the insulation strip.

The connection carrier serves in particular as a carrier for an electronic component. The connection carrier may comprise at least two conductor strips, which each serve in electrical contacting of at least one electronic component. In this case it is possible for two conductor strips, which are provided for electrical contacting of two different polarities, to be bridged by an ESD protection diode.

The carrier plate may in particular comprise a mounting region with a mounting surface remote from the bottom face. An electronic component may be positioned on the mounting surface in the mounting region. The conductor strip here serves in electrical contacting of the electronic component. The mounting surface may be a part of the top face. Alternatively or in addition, it is possible for the mounting surface to be formed at least in places by the adhesive surface. The adhesive surface and/or the top face may be freely accessible from outside in regions of the carrier plate located outside the mounting region. In other words, the insulation strip does not completely cover the top face in regions outside the mounting region and/or the conductor strip does not completely cover the adhesive surface in regions outside the mounting region.

The carrier plate may be of multilayer configuration. The carrier plate may comprise a base plate, a dielectric multilayer system and optionally a metallic reflective layer. An exposed outer face of the base plate may form the bottom face of the carrier plate. Furthermore, an exposed outer face of the dielectric multilayer system may form the top face of the carrier plate.

It is in particular possible for the bottom face to be formed by a metallic area such as, for example, the exposed outer face of the base plate. The bottom face may be externally freely accessible and/or electrically contactable. In other words, in the finished connection carrier, the bottom face is not completely covered by an electrically insulating material.

The base plate may in particular be formed with a metal such as, for example, aluminum or consist of a metal. A side of the base plate remote from the bottom face may be anodized and/or coil-anodized. Use of a metallic base plate provides the carrier plate with good thermal conductivity.

The metallic reflective layer may optionally be applied to a side of the base plate remote from the bottom face. The metallic reflective layer may, for example, be formed with aluminum or silver or consist of one of these materials. A layer sequence, which may contain an anodized layer, may be provided between the base plate and the metallic reflective layer. The anodized layer may contain an oxide, in particular aluminum oxide or silver oxide. The anodized layer may, for example, have been produced by electrolytic oxidation, in particular of aluminum or silver. In addition, the layer sequence may contain an adhesion-promoting layer.

The dielectric multilayer system may comprise multiple layers, wherein at least one of the layers of the multilayer system may contain or consist of an oxide. The multilayer system, for example, contains $TiO_2$, $SiO_2$, $Al_2O_3$, $Nd_2O_5$ or $Ta_2O_5$. The multilayer system may in particular take the form of a dielectric mirror such as, for example, a Bragg mirror.

In the connection carrier, the top face of the carrier plate may have a reflectivity of at least 80%, preferably at least 85% and particularly preferably at least 90% at a wavelength of at least 430 nm, preferably at least 440 nm, and at most 700 nm, in particular at a wavelength of 450 nm. In other words, visible light impinging perpendicular to the main plane of extension on the top face of the carrier plate is reflected with a probability of at least 80%, preferably at least 85% and particularly preferably at least 90%. The carrier plate is thus highly reflective for visible, in particular for blue, light. Such a highly reflective, in particular multilayer carrier plate may be provided inexpensively.

Use of a highly reflective carrier plate allows an improvement in outcoupling efficiency when an optoelectronic semiconductor chip is mounted on the connection carrier. Thus, efficient reflection of light emitted in the direction of the connection carrier is enabled by the carrier plate, in particular when a volume emitter is used that emits light in all spatial directions. The reflected light may thus continue to be used. In addition, the base plate may exhibit high thermal conductivity, whereby heat from an electronic component mounted on the connection carrier may be efficiently dissipated via the base plate.

The connection carrier need not be connected electrically conductively by surface mounting (SMT, Surface Mountable Device). In other words, the conductor strip is only freely accessible at a contact area remote from the bottom face of the carrier plate. In particular, the conductor strip only extends on the top face of the carrier plate.

The insulation strip may cover the entire top face. In particular, the insulation strip completely covers the entire top face. The insulation strip may, for example, be applied as a protective layer, protective encapsulation or protective film on the top face of the carrier plate. The insulation strip is transparent. One component of the carrier plate is here and hereinafter transparent if the material of the component has a transmissivity of at least 80%, preferably at least 90% and particularly preferably at least 95%, at a wavelength of at least 430 nm, preferably at least 440 nm, and at most 700 nm, in particular at a wavelength of 450 nm. In other words, visible, in particular blue, light is readily transmitted by the insulation strip and may then be reflected by the carrier plate.

In this case, the insulation strip may in particular be formed with organic materials such as, for example, acrylates, fluoropolymers, polyurethanes or polyesters or consist of at least one of these materials. Alternatively or in addition, the insulation strip may be formed with or consist of sol-gels such as, for example, siloxanes, water glass or monoaluminum phosphate (Berlinite). The organic materials and/or the sol-gels may, for example, be sprayed or spin-coated onto the top face.

The conductor strip may have a length and a width. In particular, along its length the conductor strip has a preferential direction, along which it extends. The width of the conductor strip amounts to at most 20%, preferably at most 10%, of the length of the conductor strip. The conductor strip is thus elongate. The width amounts, for example, to at least 0.4 mm and at most 5 mm. The length may amount to at least 4 mm and at most 100 mm.

Along its length, the conductor strip covers at least 90% of the carrier plate. In addition, over its width the conductor strip covers at least 5% and at most 20% of the carrier plate. The length of the conductor strip may extend within the bounds of manufacturing tolerances in a first lateral direction of the carrier plate. Furthermore, the width of the conductor strip may extend within the bounds of manufacturing tolerances in a second lateral direction which is perpendicular to the first lateral direction. The length of the conductor strip then amounts to at least 90% of a first extent of the carrier plate in the first lateral direction. In addition, the width of the conductor strip amounts to at least 5% and at most 20% of a second extent of the carrier plate in the second lateral direction.

The conductor strip additionally has a thickness extending transversely of or perpendicular to the width and the length. The thickness of the conductor strip amounts to at least 25 μm, preferably at least 40 μm, and at most 200 μm, preferably at most 150 μm.

The at least one insulation strip may have a length and a width. In particular, along its length the insulation strip has a preferential direction, along which it extends. The width of the insulation strip may amount to at most 25%, preferably 15%, of the length of the insulation strip. The length of the insulation strip amounts at least to the length of the conductor strip. In other words, the insulation strip is precisely as long or longer than the conductor strip.

Furthermore, the width of the insulation strip amounts to at least 100 μm more than the width of the conductor strip. Alternatively or in addition, the width of the insulation strip corresponds to at least 1.25 times, preferably at least 1.5 times, the width of the conductor strip.

Because the insulation strip is wider than the conductor strip, creepage distances may be increased between the conductor strip and the carrier plate to thereby ensure better insulation of the conductor strip relative to the carrier plate.

It is possible for an insulation strip to be associated one-to-one with each conductor strip. The conductor strip may be arranged centered relative to the insulation strip. In other words, a center axis of the conductor strip along the length and/or along the width may, within the bounds of manufacturing tolerances, correspond to a center axis of the insulation strip along the length and/or along the width.

The carrier plate may be of multilayer configuration and comprises the base plate and a transparent coating, which is electrically insulating. An outer face, remote from the base plate, of the transparent coating forms the top face of the carrier plate. The top face is in particular of simply connected configuration. In other words, the transparent coating may be of one piece or contiguous configuration and completely cover over the base plate. The transparent coating may in particular be formed with the above-stated organic materials and/or the above-stated sol-gels or consist of one of these materials.

For example, the carrier plate may comprise the dielectric multilayer system and the transparent coating may be part of the dielectric multilayer system. In particular, the transparent coating may cover the other layers of the multilayer system over the entire or complete surface thereof. The transparent coating may in particular improve the corrosion stability of the carrier plate relative to environmental influences. Furthermore, the transparent coating may increase the dielectric strength and creepage distance extension, in addition to the insulation strip. In particular, the connection carrier may then comprise the contiguous transparent coating and the at least one insulation strip applied to the transparent coating.

An insulation strip may be associated one-to-one with each conductor strip and the top face of the carrier plate is of simply connected configuration. Such a connection carrier is particularly simple and inexpensive to produce.

Side faces of the carrier plate may have a multiplicity of pockets. The pockets are formed by notches at the side faces of the carrier plate. The side faces may be outer faces of the carrier plate connecting the bottom face and the top face. At least one of the pockets is covered over at least in part by the at least one conductor strip.

The side faces of the carrier plate may be covered at least in the region of the pockets at least in part with an insulation layer. The insulation layer may in particular directly adjoin the side faces. The side faces may be covered completely by the insulation layer in the region of the pockets such that the side faces are no longer freely accessible in the region of the pockets.

The insulation layer may be of electrically insulating configuration. The insulation layer may contain organic dielectrics based on acrylate, polyurethane, silicone or an epoxide or consist of one of these materials. Alternatively or in addition, the insulation layer may be formed with a polyester or a polyimide. Furthermore, the material of the insulation layer may be curable by UV radiation and/or thermally. In particular, the insulation layer may be applied to the side faces by jetting, dispensing or printing. In this case, it is possible for recesses and/or the pockets to be filled with the insulation layer during production and then for part of the insulation layer to be removed such that, in each case, only regions of the insulation layer remain on the side faces.

A region of the conductor strip and a region of the insulation strip may be folded over in the region of the pocket. The folded-over region of the conductor strip and the folded-over region of the insulation strip are arranged on a side, remote from the carrier plate, of the non-folded-over region of the conductor strip. Furthermore, in the region of the pocket, the conductor strip is covered over by the folded-over region of the insulation strip. In particular, the conductor strip may be completely covered by the insulation strip on the side face. The conductor strip may then no longer be freely accessible at the side face and in particular be externally electrically insulated.

We also provide an optoelectronic semiconductor component. The optoelectronic semiconductor component comprises a connection carrier described here. This means that all the features disclosed for the connection carrier are also disclosed for the optoelectronic semiconductor component and vice versa.

The optoelectronic semiconductor component may comprise the connection carrier and at least one optoelectronic semiconductor chip with connection points. The connection points serve in particular in electrical contacting of the optoelectronic semiconductor chip. The optoelectronic semiconductor chip may be provided for the emission and/or absorption of light. The optoelectronic semiconductor chip may be a light-emitting diode chip and/or a photodiode chip. In particular, the semiconductor chip emits blue light. In particular, the optoelectronic semiconductor chip may be a volume emitter which emits in all spatial directions.

The at least one semiconductor chip may be applied to the mounting surface of the carrier plate in a mounting region of the connection carrier. The semiconductor chip may be in direct contact with the mounting surface. The mounting surface may be a part of the top face.

At least one of the connection points may electrically conductively connect to the at least one conductor strip. Electrical connection of the conductor strip with the connection point may proceed, for example, by wire bonding.

The connection carrier may comprise at least two conductor strips. Each of the conductor strips is electrically insulated from the carrier plate by the at least one insulation strip. In addition, each connection point electrically conductively connects with at least one conductor strip. In other words, the connection points of the semiconductor chips are not electrically contacted via the carrier plate and/or electrically conductively connected with the carrier plate.

The method described here, the connection carrier described here and the optoelectronic semiconductor component described here are explained in greater detail below with reference to examples and the associated figures.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

An example of a connection carrier and a method will be explained in greater detail with reference to the perspective view in FIG. 1. A method step is shown prior to singulation of the connection carriers.

Each connection carrier comprises a carrier plate 1 with a top face 1a.

An insulation strip 2 is applied to the top face 1a. Furthermore, a conductor strip 3 is applied to an adhesive surface 2a, remote from the top face 1a, of the insulation strip 2. The insulation strip 2 and the conductor strip 3 extend in one of the lateral directions of the carrier plate 1. In the example shown, a conductor strip 3 is associated one-to-one with each insulation strip 2.

The carrier plate 1 additionally comprises mounting regions 15, one part of the top face 1a forming a mounting surface 15a. In the mounting regions 15, an electronic component (not shown in FIG. 1) may be applied to the mounting surface 15a.

The carrier plate 1 further comprises recesses 4. Each recess 4 has a main direction of extension. Singulation of the connection carriers may take place along the recesses 4. The recesses 4 comprise pockets 41. In the regions of the pockets 41, the recesses 4 have a greater extent perpendicular to their respective main direction of extension than outside the pockets 41. In the region of the pockets 41, the conductor strip 3 and the insulation strip 1 cover over the recesses 4.

Bridges 42 are provided between the recesses 4, at which bridges individual regions of the carrier plate 1 continue to be of contiguous configuration. Singulation of the connection carriers may take place through these bridges 42. In addition, the bridges 42 may ensure connection carrier flexibility, which is required, for example, for winding onto a reel.

Figure 2:
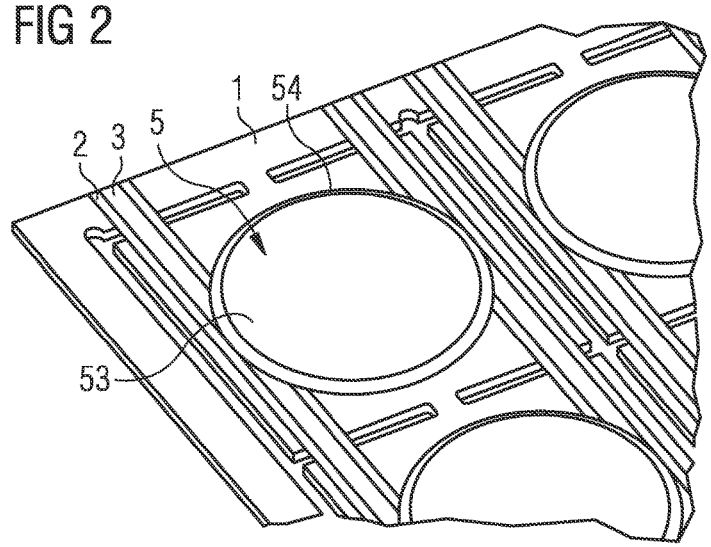
FIGS. 2 and 3 show examples of a connection carrier described here and of an optoelectronic semiconductor component described here.

An example of a connection carrier and an optoelectronic semiconductor component will be explained in greater detail with reference to the schematic view in FIG. 2. In the example illustrated, an optoelectronic semiconductor chip 5 is applied to the top face 1a (not shown in any greater detail in FIG. 1). The connection carrier used corresponds to the example of FIG. 1. The semiconductor chip 5 is encapsulated with a conversion potting compound 53. The conversion potting compound 53 serves in wavelength conversion of the light emitted by the optoelectronic semiconductor chip 5. The conversion potting compound 53 is surrounded at outer regions by a stop dam 54 that serves as a stopping edge for the conversion potting compound 53.

Figure 3:
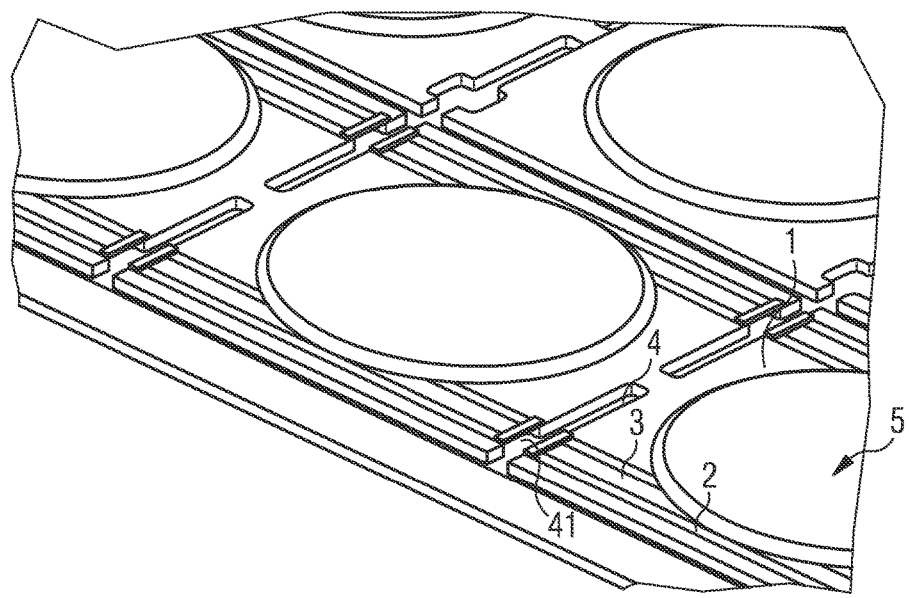

A further example of a connection carrier and an optoelectronic semiconductor component will be explained in greater detail with reference to the schematic view in FIG. 3, wherein, in contrast to the examples of FIGS. 1 and 2, the conductor strips 3 and the insulation strips 2 have been singulated between the connection carriers and are no longer joined together. This singulation of the conductor strips 3 and the insulation strips 2 takes place in the region of the pockets 41 of the recesses 4.

Figure 4:
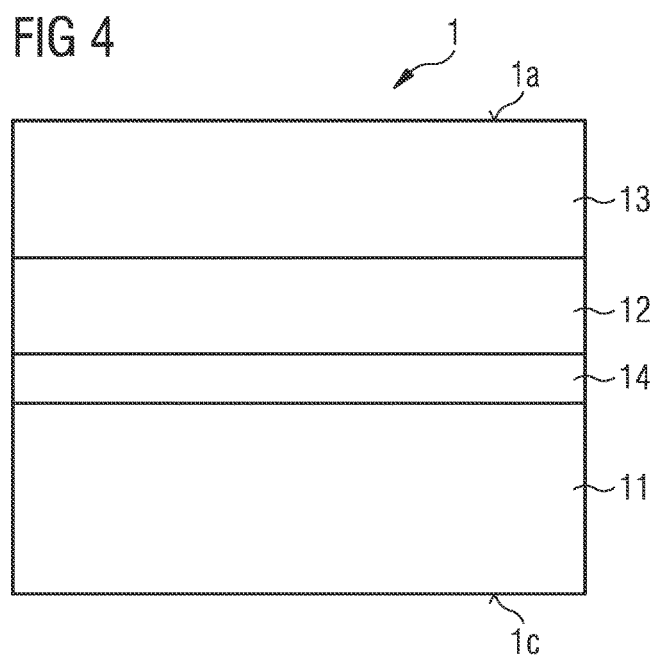
FIG. 4 shows an example of a carrier plate for a connection carrier described here.

An example of a carrier plate 1 for a connection carrier described here is explained in greater detail with reference to the schematic sectional view of FIG. 4. The carrier plate 1 is of multilayer configuration and comprises a base plate 11, the exposed outer face of which forms a bottom face 1c remote from the top face 1a of the carrier plate 1. On a side, remote from the bottom face 1b, of the base plate 11, a layer sequence 14 is mounted, by which a metallic reflective layer 12 may connect with the base plate 11. The layer sequence 14 may comprise an anodized layer, which may be formed with aluminum oxide or silver oxide. Furthermore, the layer sequence 14 may comprise an adhesion-promoting layer, which may serve in connecting the base plate 11 and the metallic reflective layer 12 and/or the multilayer system 13. It is however also possible for the carrier plate 1 not to comprise a metallic reflective layer 12 and/or a layer sequence 14.

A dielectric multilayer system 13 is applied to the side, remote from the bottom face 1c, of the base plate 11 or of the optional metallic reflective layer 12. An exposed outer face of the dielectric multilayer system 13 forms the top face 1a of the carrier plate 1. The dielectric multilayer system 13 comprises multiple layers (not shown in FIG. 4) that may jointly form a dielectric mirror. In particular, the multilayer system 13 may comprise a transparent coating, the outer face of which, remote from the base plate 11, may form the top face 1a.

Figure 5:
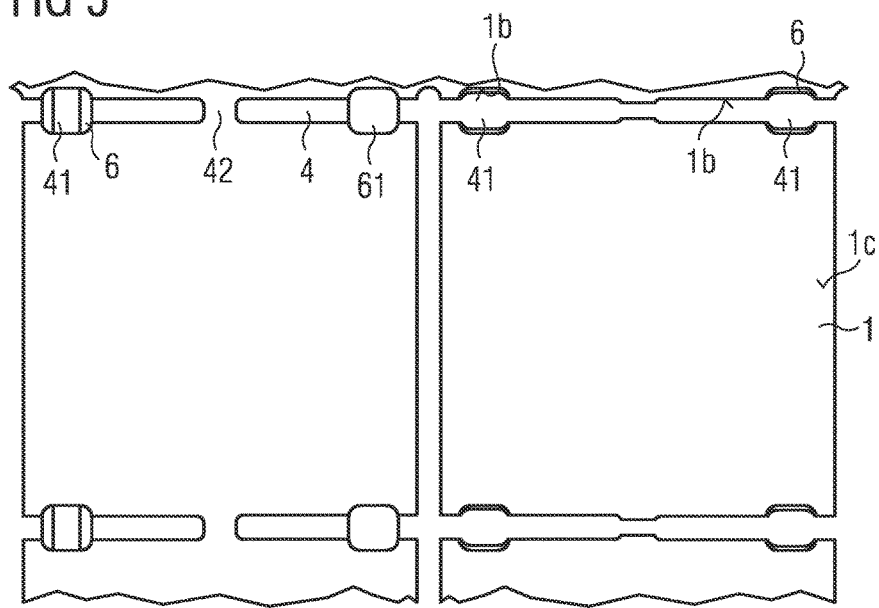

An example of a connection carrier and of a method is explained in greater detail with reference to the schematic plan views of FIGS. 5 and 6. The plan view in FIG. 5 is directed onto the bottom face 1c and in FIG. 6 onto the top face 1a of the carrier plate 1. The left-hand side of FIGS. 5 and 6 in each case shows a method step prior to stamping out, while the right-hand side shows a method step subsequent to stamping out.

Figure 6:
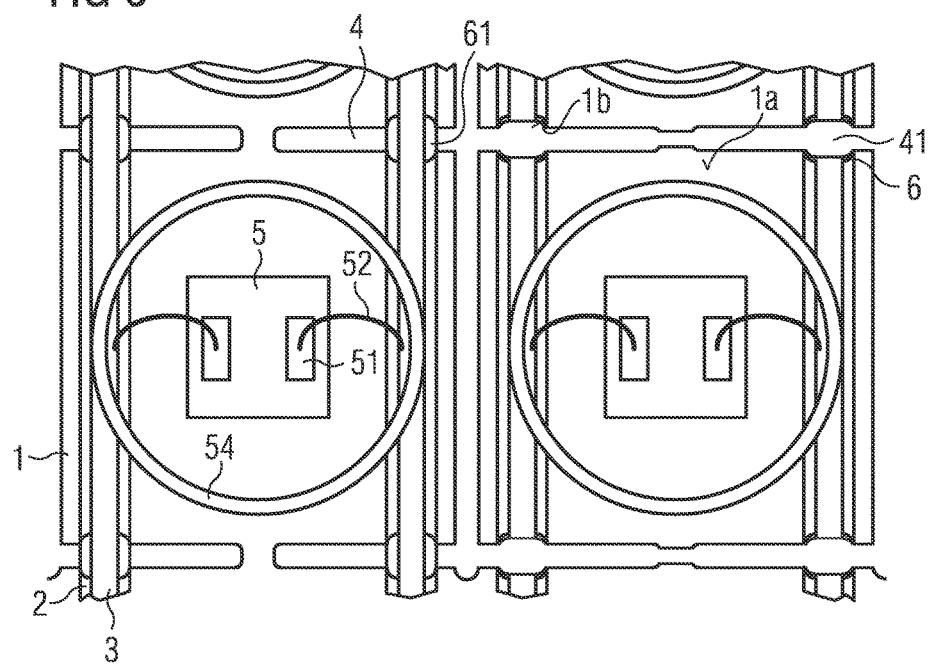

In the method step shown on the left-hand side of FIGS. 5 and 6, recesses 4 and pockets 41 have been introduced into the carrier plate 1. The pockets 41 are partly covered over by the conductor strip 3 and the insulation strip 2. The pockets 41 of the recesses 4 are filled with an insulating material 61. Jetting, dispensing or printing may be used for this purpose, for example. The region of the insulation strip 2 or of the conductor strip 3 that covers the pockets 41, may in this case prevent the insulating material 61 from running off in the direction of the top face 1a.

In the method step shown on the right-hand side of FIGS. 5 and 6, a stamping-out operation has been carried out. In this operation, part of the insulating material 61 is removed. The parts of the insulating material 61 that have not been removed then form an insulation layer 6. Side faces 1b of the carrier plate 1 are covered by the insulation layer 6 in the region of the pockets 41.

In addition, FIG. 6 shows an optoelectronic semiconductor chip 5 with connection points 51 that are each connected to a conductor strip 3 by wire bonding 52. Unlike what is shown in FIG. 6, it is possible for a multiplicity of optoelectronic semiconductor chips 5, for example, in the form of multi-dies or multi-chips, to be mounted on the mounting surface 15a. In this case, multiple optoelectronic semiconductor chips 5 interconnected in series and/or parallel with one another may be mounted on the mounting surface 15a.

An example of a connection carrier and an optoelectronic semiconductor component will be explained in greater detail with reference to the perspective view in FIG. 7. The example shown again shows the pockets 41 of the recesses 4, wherein the insulation layer 6 is mounted on the side faces 1b of the carrier plate 1 in the region of the pockets 41.

An example of a connection carrier and an optoelectronic semiconductor component will be explained in greater detail with reference to the perspective view in FIG. 8. The insulation strip 2 and the conductor strip 3 are folded over in the example in the region of the pockets 41. In this case, folded-over regions of the insulation strip 21 and folded-over regions of the conductor strip 31 cover over non-folded-over regions of the conductor strip 3. At the side faces 1b, the conductor strip 3 is no longer freely accessible. The conductor strip 3 is electrically insulated at the side faces 1b by the folded-over region of the insulation strip 21.

In the region of the pockets 41, at the side faces 1b of the carrier plate 1 in the direction away from the top face 1a, there are arranged first of all the non-folded-over insulation strip 2, then the non-folded-over conductor strip 3 and subsequently, on a side remote from the top face 1a, the folded-over region 31 of the conductor strip 3 and then the folded-over region 21 of the insulation strip 2.

The description made with reference to examples does not restrict this disclosure to the examples. Rather, this disclosure encompasses any novel feature and any combination of features, including in particular any combination of features in the appended claims, even if the feature or combination is not itself explicitly indicated in the claims or examples.

Priority is claimed from DE 102015107657.8, the subject matter of which is incorporated herein by reference.

The invention claimed is:

1. A method of producing at least one connection carrier, comprising:
   A) providing a carrier plate with a planar top face,
   C) applying at least one electrically conductive conductor strip to an adhesive surface of an insulation strip and cohesively connecting the insulation strip and the conductor strip, and
   B) applying at least one electrically insulating insulation strip to the planar top face and cohesively connecting the carrier plate and the insulation strip,
   wherein the conductor strip and the carrier plate are electrically insulated from one another by the insulation strip, and the insulation strip and the conductor strip are applied jointly to the carrier plate.

2. The method according to claim 1, wherein the cohesive connection in step B) and/or the cohesive connection in step C) is performed using a laminating process and/or an adhesive bond.

3. The method according to claim 1, wherein step A) and step C) and, optionally, step B) are performed using a reel-to-reel process.

4. The method according to claim 1, wherein
   prior to step B) a multiplicity of recesses is introduced into the carrier plate, and
   the application in step C) proceeds such that the conductor strip covers over at least one of the recesses at least in places in a covered-over region of the recess.

5. The method according to claim 1, wherein, after step C), in a further step D), a region of the conductor strip and a region of the insulation strip are folded over in the covered-over region of the recess,
   the folded-over region of the conductor strip and the folded-over region of the insulation strip are then arranged on a side, remote from the carrier plate, of the non-folded-over region of the conductor strip, and
   after folding-over, the conductor strip is covered up at the covered-over region of the recess by the folded-over region of the insulation strip.

6. A connection carrier for electronic components, comprising:
   a carrier plate with a planar top face,
   at least one electrically insulating insulation strip applied to the top face, and
   at least one electrically conductive conductor strip applied to an adhesive surface, remote from the top face, of the insulation strip, wherein
   the carrier plate and the insulation strip and the insulation strip and the conductor strip are in each case cohesively connected,
   the conductor strip and the carrier plate are electrically insulated from one another by the insulation strip,
   the carrier plate is of multilayer configuration and comprises a base plate, a dielectric multilayer system and, optionally, a metallic reflective layer, and
   the top face of the carrier plate has a reflectivity of at least 80% and at a wavelength of at least 430 nm and at most 700 nm.

7. The connection carrier according to claim 6, wherein the connection carrier is not connectable using surface mounting (SMT).

8. The connection carrier according to claim 6, wherein
   the insulation strip covers the entire top face, and
   the insulation strip is transparent.

9. The connection carrier according to claim 6, wherein
   the carrier plate is of multilayer configuration and comprises the base plate and a transparent coating, which is electrically insulating, and
   an outer face, remote from the base plate, of the transparent coating forms the top face of the carrier plate.

10. The connection carrier according to claim 6, wherein a region of the conductor strip and a region of the insulation strip is folded over in the region of the pockets,
    the folded-over region of the conductor strip and the folded-over region of the insulation strip are arranged on a side, remote from the carrier plate, of the non-folded-over region of the conductor strip, and
    the non-folded-over region of the conductor strip is covered in the region of the pockets by the folded-over region of the insulation strip.

11. The connection carrier according to claim 6, wherein
    an insulation strip is associated one-to-one with each conductor strip, and
    the top face is of simply connected configuration.

12. The connection carrier according to claim 6, wherein the at least one conductor strip has a length (L) and a width (B),
    the width of the conductor strip amounts to at most 20% of the length of the conductor strip, and
    along its length, the conductor strip covers at least 90% of the carrier plate and over its width at least 5% and at most 20% of the carrier plate.

13. The connection carrier according to claim 12, wherein the at least one insulation strip has a length and a width, the length of the insulation strip amounts to at least the length of the conductor strip, and the width of the insulation strip amounts to at least 100 m more than the width of the conductor strip and/or the width of the insulation strip corresponds to at least 1.25 times the width of the conductor strip.

14. The connection carrier according to claim 6, wherein side faces of the carrier plate comprise a multiplicity of pockets formed by notches in the carrier plate and at least one of the pockets is covered over at least in part by the conductor strip.

15. The connection carrier according to claim 14, wherein the side faces of the carrier plate are covered at least in the region of the pockets at least in part with an insulation layer.

16. An optoelectronic semiconductor component comprising:
the connection carrier according to claim 6, and
at least one optoelectronic semiconductor chip with connection points, wherein
the at least one semiconductor chip is applied to a mounting surface of the carrier plate in a mounting region of the connection carrier, and
at least one connection point electrically conductively connects with the at least one conductor strip.

17. The optoelectronic semiconductor component according to claim 16, wherein
the connection carrier comprises at least two conductor strips electrically insulated from the carrier plate by the at least one insulation strip, and
each connection point electrically conductively connects with at least one conductor strip.

18. A connection carrier for electronic components, comprising:
a carrier plate with a planar top face,
at least one electrically insulating insulation strip applied to the top face, and
at least one electrically conductive conductor strip applied to an adhesive surface, remote from the top face, of the insulation strip, wherein
the carrier plate and the insulation strip and the insulation strip and the conductor strip are in each case cohesively connected,
the conductor strip and the carrier plate are electrically insulated from one another by the insulation strip, and
the connection carrier is not connectable using surface mounting (SMT).

* * * * *

UNITED STATES PATENT AND TRADEMARK OFFICE
CERTIFICATE OF CORRECTION

PATENT NO. : 10,468,569 B2
APPLICATION NO. : 15/574385
DATED : November 5, 2019
INVENTOR(S) : Erich et al.

Page 1 of 1

It is certified that error appears in the above-identified patent and that said Letters Patent is hereby corrected as shown below:

On the Title Page

At (73) Assignees: please change "OSRAM Opto Semiconductor GmbH" to --OSRAM Opto Semiconductors GmbH--.

Signed and Sealed this
Twenty-first Day of January, 2020

Andrei Iancu
*Director of the United States Patent and Trademark Office*